United States Patent [19]
Besocke

[11] Patent Number: 4,785,177
[45] Date of Patent: Nov. 15, 1988

[54] KINEMATIC ARRANGEMENT FOR THE MICRO-MOVEMENTS OF OBJECTS

[75] Inventor: Karl-Heinz Besocke, Julich, Fed. Rep. of Germany

[73] Assignee: Kernforschungsanlage Julich Gesellschaft mit beschrankter Haftung, Fed. Rep. of Germany

[21] Appl. No.: 25,336

[22] Filed: Mar. 13, 1987

[30] Foreign Application Priority Data

Mar. 27, 1986 [DE] Fed. Rep. of Germany ....... 3610540

[51] Int. Cl.$^4$ .............................................. G21K 5/10
[52] U.S. Cl. .............................. 250/442.1; 250/440.1; 250/306; 310/328; 310/330
[58] Field of Search ................. 250/306, 442.1, 440.1; 318/37, 38, 115, 116; 310/311, 328, 330; 378/34

[56] References Cited

U.S. PATENT DOCUMENTS

| | | | |
|---|---|---|---|
| 4,163,168 | 7/1979 | Ishikawa et al. | 250/442.1 |
| 4,195,243 | 3/1980 | Thaxter | 250/442.1 |
| 4,343,993 | 8/1982 | Binnig et al. | 250/306 |
| 4,442,002 | 12/1983 | Binnig et al. | 310/328 |

FOREIGN PATENT DOCUMENTS 166499 1/1986 European Pat. Off. ......... 250/442.1

Primary Examiner—Carolyn E. Fields
Assistant Examiner—John A. Miller
Attorney, Agent, or Firm—Scully, Scott, Murphy & Presser

[57] ABSTRACT

A kinematic arrangement for the micro-movement over long distances of objects, and in particular, for imparting movement to and the manipulation of objects which are to be investigated or treated microscopically. The object is supported on at least one motion-imparting or kinematic element constituted of piezoelectric material, which is deformable through the application of electrical voltages. The supporting point or points of the kinematic or motion-imparting elements is or are changed in position through a deformation of the piezoelectric material due to the application of electrical voltage variations to the kinematic element, which so changes in its position that the object which is supported by the kinematic elements will move in desired directions within a plane predetermined by the supporting points.

13 Claims, 8 Drawing Sheets

KINEMATIC ARRANGEMENT FOR THE MICRO-MOVEMENTS OF OBJECTS

BACKGROUND OF THE INVENTION

1. Field of the Invention

The present invention relates to a kinematic arrangement for the micro-movements of objects also over large distances. In particular, the kinematic arrangement serves for imparting movement to and the manipulation of objects which are to be investigated microscopically.

2. Description of the Prior Art

Mechanically highly-precise operating sequences, in an increasing measure, are required in the modern micro-technology. The mechanical control elements which have been heretofore employed for this purpose to the greatest extent, and which are equipped with lever systems, gears and micrometer screws, in many instances cannot meet the necessary demands. In order to carry out micro-movements, electromagnetic or piezoelectric control elements are better suited for such purposes.

For instance, extremely precise micro-movements are necessary for the Scanning-Tunneling Microscope (STM), described in the article "Das Raster-Tunnelmicroscop", by G. Binnig and H. Rohrer, Helvetia Phys. Acta—55, 1982, page 726. The STM necessitates the highest degree of precision and stability for the movement of the object under investigation. Thus, for the scanning of the object, as well as for the manipulation of the object, a prerequisite is precision movements within the nanometer range in order to achieve the desired results. These movements must be carried out and controlled dependably, repeatedly and rapidly.

The currently known control elements for STM's utilize a combination of three piezoelectric control elements for the scanning operation (a tripod with one control element in each of the three coordinate directions x, y, z) and further control elements for the manipulation of the object which operate either piezoelectrically, electromagnetically or mechanically, G. Binnig and H. Rohrer, "Das Raster-Tunnelmikroskop", Spektrum der Wissenschaft, 1985, pages 62–68; J. Moreland, et al., "Electromagnetic Squeezer for Compressing Squeezable Electron Tunnel Junctions", Rev. Sci. Instrum., 55, 1984, page 399. The complex construction of these control elements is susceptible to disturbances; vibrations and temperature drifts are almost impossible to avoid. Moreover, critical is the necessity of a high voltage operation of these elements.

A two-directional piezoelectric driven fine adjusting device is disclosed in Ishikawa, U.S. Pat. No. 4,163,168, in which first and second counter piezo-electric members which are fixed to each other are expandable and contractable in directions differing from each other responsive to the selective application of electrical signals. Slide members are fixed to the piezoelectric members and some into sliding contact with a base and electrical attraction devices which are responsive to applied electrical signals for attracting and fasting the slide members to a movable plate. The device disclosed herein is cumbersome and does not afford the accuracy of movement contemplated by the inventive kinematic arrangement.

SUMMARY OF THE INVENTION

Accordingly, it is an object of the present invention to provide an arrangement for implementing motion sequences, which features a high degree of stabililty, a precise control over the movement, simple construction, low susceptibility to vibrations and a low temperature drift.

The foregoing object is achieved through the provision of a kinematic arrangement of the above-mentioned type, in accordance with which the object is supported on at least one motion-imparting or kinematic element constituted of piezoelectric material, and which is deformable through the application of electrical voltages. Supports or supporting points for the object on the kinematic or motion-imparting element are changed in position through a deformation of the piezoelectric material due to the application of electrical voltage variations to the kinematic element, which so changes in its position that the object which is supported by the kinematic element will move in desired directions within a plane predetermined by the location of the object on the supports. This motion can be purely translatory, however, the object can also be caused to be rotated about an axis or tilted by the kinematic element.

Pursuant to another aspect of the invention, the kinematic arrangement may include a plurality of object-supporting kinematic elements, preferably although not necessarily consisting of three such elements each possessing a support-point or plane for the object to be able to impart the desired, above-mentioned motion to the object. For this purpose, each of the three piezoelectric kinematic elements is separately actuatable.

Pursuant to a further feature of the invention, it is contemplated that at least one part of the motion-imparting or kinematic element is constructed hollow-cylindrically and provides a supporting surface for the object at the end of the kinematic element. The supporting surface for the object at the end of the hollow-cylindrical kinematic element may e.g. consist of a plurality of circumferentially spaced support balls or spheres; for example, three equally spaced balls to provide a stable positioning of the object on the kinematic element. Such a cylindrical kinematic element possesses a high mechanical rigidity.

Preferably, the hollow-cylindrical kinematic element is or the kinematic elements are equipped on one of its or their cylindrical walls with a closed electrically-conductive coating and on its or their other cylindrical wall with a plurality of electrically-conductive part coatings which are insulated relative to each other. In this construction, as a result of the application of a voltage between the coatings present on both cylinder walls, there is obtained either a shortening or elongation of the kinematic element. For effectuating a bending of the kinematic element, a voltage is applied between the closed coating and a part coating.

Furthermore, through a superposition of the applied voltages it is possible to implement all of the positional changes which are required for the movement of the object. The electrical voltages which are necessary therefor can be maintained relatively low by using thin walled kinematic elements.

Expediently, the part coatings which are insulated relative to each other extend along one of the cylinder walls in the direction along the axis of the cylinder. The part coatings are separated from each other by insulations which extend between the part coatings in parallel with the axis of the cylinder. Due to technology reasons the electrically conductive part coatings are preferably arranged on the outer cylinder wall.

By superposition of voltages applied to the inner and outer coatings and by voltages applied to the part coatings the kinematic element can be elongated or shortened and can be bended in any desired direction. The kinematic elements can, thusly, be extremely exactly controlled in the X, Y and Z direction by the superposition of the voltages.

An optimized electrical control over the kinematic elements is attained when every electrically-conductive coating on the cylinder surfaces of a kinematic element is separately controllable. An adjustment of the resting position of the kinematic elements can be achieved through the application of a direct-current (D.C.) voltage upon which there is superimposed the alternating-current (A.C.) voltage necessary for the operation.

Preferred areas of application for the inventive kinematic arrangement are microscopes, including light-optical and electron microscopes, especially scanning electron microscopes. Hereby, the kinematic arrangement serves as an object carrier or support for the objects which are to be examined microscopically. Also for the analysis and processing of objects utilized in the micro-technology; for example, in the high-integration electronic structures, the kinematic arrangement is adapted for the manipulation of objects. The kinematic element can also be applied to an axially supported object in order to provide micro rotations.

Particularly advantageous is the utilization of the kinematic arrangement as an object support and scanning provision for a Scanning Tunneling Microscope (STM). For this case of utilization, the kinematic arrangement is rigidly interconnected with a scan element on which the tunnel tip is fastened. This type of connection between the kinematic object support and scanning elements onto one compact modular unit, leads to a high degree of mechanical stability and unsusceptibility to temperatures in the Scanning Tunneling Microscope. In accordance with one embodiment, the scan element is constructed in the same manner as is a kinematic element. Hereby, it especially consists of a hollow-cylindrical piezoelectric material which, on its inner and outer cylindrical walls, is provided with electrically-conductive coatings or, respectively, part coatings. This analogous construction of the scan element and the kinematic elements in the utilization of the kinematic arrangement in an STM leads to a high degree of freedom from vibration and to compensation of the temperature drift. Moreover, the same construction for the kinematic elements and the scan element also facilitates that the scanning movement which is necessary for the STM utilization can be carried out by the kinematic elements instead of the scan element.

For temperature measurement of the object, at least one of the kinematic elements may be equipped with a thermal sensor.

In accordance with another feature of the invention, it is possible to position the object stationarily, to place the kinematic arrangement upside down onto the object and let the kinematic arrangement walk over the surface of the object. Thereby enabling the investigation of larger objects.

BRIEF DESCRIPTION OF THE DRAWINGS

Further features, advantages, and objects of the present invention may now be readily ascertained from the following detailed description of exemplary embodiments thereof, taken in conjunction with the accompanying drawings; in which.

DETAILED DESCRIPTION

Figure 1:
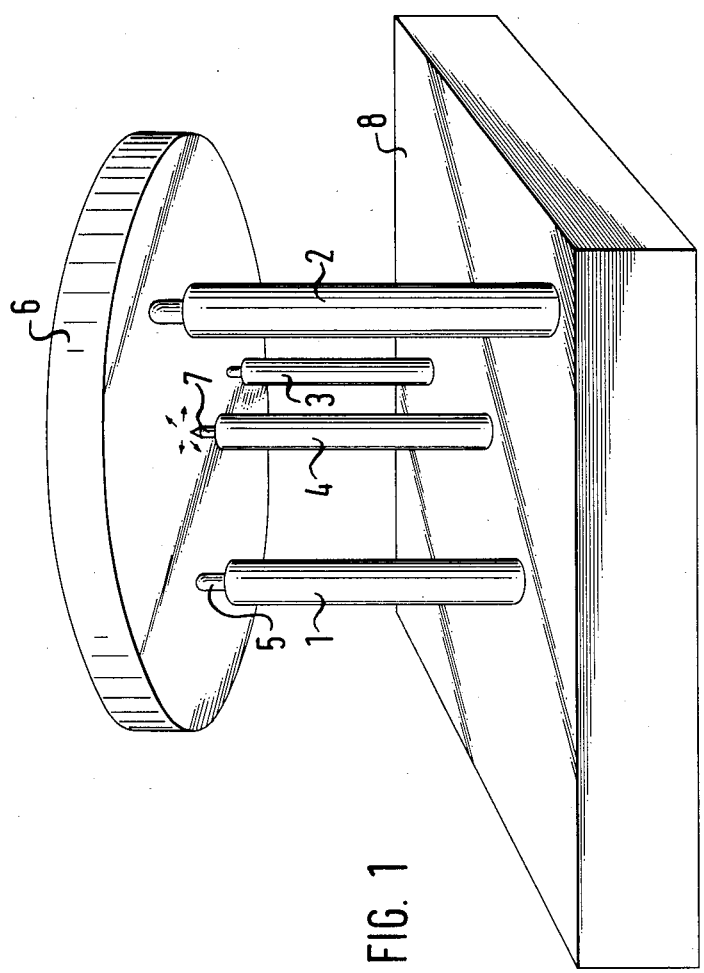
FIG. 1 generally schematically illustrates a perspective view of a kinematic arrangement as an object support and scan element utilized in a Scanning Tunneling Microscope (STM)

FIG. 1 illustrates a kinematic arrangement for a Scanning Tunneling Microscope (STM) which is constituted of three motion-imparting or kinematic elements 1, 2, 3; including a scan element 4 which is herein centrally located intermediate the kinematic elements 1, 2, 3 for the measurement of the tunnel current. All kinematic elements 1, 2, 3 and the scan element 4 (each) possess the same construction. For the configuration of the elements in the disclosed embodiment, there are employed cylindrical components constituted of a piezoelectric material; for example, piezoceramic, whereby the kinematic elements are provided at one end with a support 5 for an object 6 which is to be examined with the STM, and wherein the scan element 4 is equipped with a tunneling tip 7.

The kinematic elements 1, 2, 3 and the scan element 4, in the embodiment, are fastened onto a common base plate 8. Voltages can be applied to each of the elements, causing a shortening or elongation, or a bending of the elements.

The object 6 rests on the supports 5 of the kinematic elements 1, 2, 3 which, in this embodiment, are spherical in shape. Through the intermediary of this three-pointed support for the object 6, there is obtained a stable support for the object. The object rests normally on the supports by gravitational force, however, it can also be pressed against the supports 5 by the elastic force of a spring.

Figure 2:
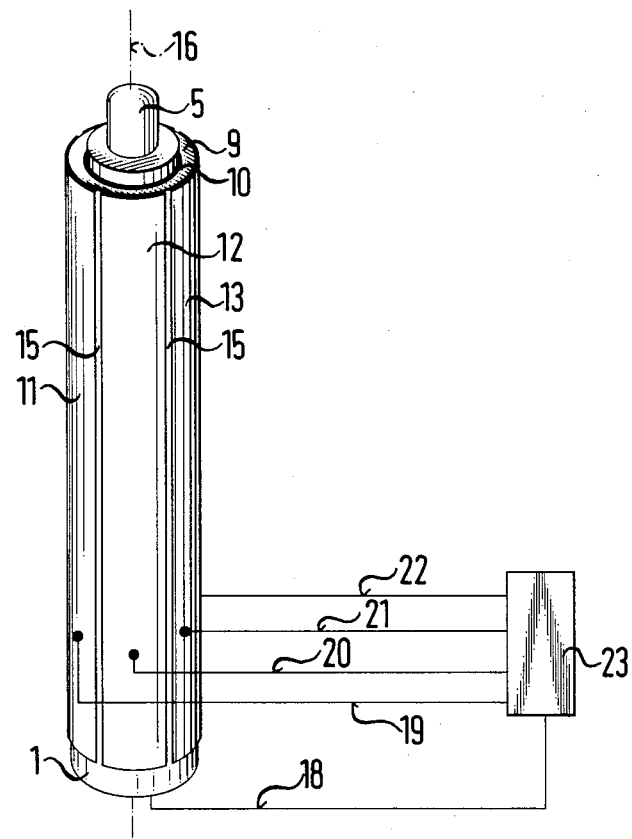
FIG. 2 illustrates a perspective view of one of the kinematic elements.
Figure 2A:
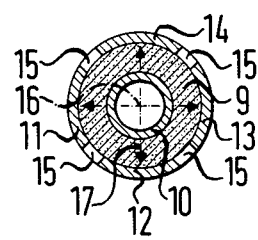
FIG. 2a illustrates a transverse sectional view through the kinematic element of FIG. 2.

The construction of kinematic elements 1, 2 or 3 is elucidated in FIG. 2 of the drawings. FIG. 2 illustrates the kinematic element with superimposed support 5 in a perspective representation. A cross-section through the kinematic element is illustrated in FIG. 2a. The kinematic element consists of a tube of piezoceramic material 9. In the illustrated embodiment, the piezoceramic tube possesses an outer diameter of 2 mm and an inner diameter of 1 mm. The inner wall of the tube 9 is coated with a closed electrically conductive layer 10, forming the inner electrode. The outer cylindrical wall of the kinematic element is provided with four electrically-conductive part coatings forming strip electrodes 11 to 14, which are electrically insulated with respect to each other through insulations 15. The part coatings 11 to 14 are arranged on the outer cylindrical wall in parallel with the axis 16 of the kinematic element, the insulations 15 extend in the direction of the axis. In the illustrated embodiment, the piezoelectric material is radially polarized, as indicated in FIG. 2a by arrows 17.

Connected to the inner coating 10 and the part coatings 11 to 14 are electrical conductors 18 to 22, for the application of voltages to the kinematic element. The required voltages for the movements of the kinematic elements in the X, Y and Z directions are provided by the generator 23.

When all part coatings 11 to 14 are on the same electrical potential, and a voltage is applied between these part coatings and the inner coatings 10, the kinematic element deforms in the axial direction; in effect, it either elongates or shortens in the Z-direction in dependence upon the polarity of the applied voltage. However, when a voltage is applied between individual part coatings and the inner coating 10 of the piezoelectric tube 9, the free end of the kinematic element possessing the support 5 bends perpendicular to its axis 16 in the X or Y direction. The bending is intensified when voltages of opposite polarity are applied between the part coatings arranged opposite each other on the outer cylindrical wall; thus for example between the part coatings 11 and 13 or 12 and 14, whereby the inner coating is at zero potential.

Through superposition of the above-mentioned voltages, the kinematic element can be deformed in such a manner that the support 5 will carry out every movement which is necessary for a desired change in position of the object, whereby the operating voltages which are required therefor are relatively low because of the dimensions and thin walled construction of the kinematic element.

The kinematic elements 1, 2, 3 and scan element 4 are so adjusted in height relative to each other than the distance between tunneling tip 7 and the surface of object 6 reaches a sufficient small gap needed for tunneling microscopy. A fine adjustment of the distance between the tunneling tip and the surface of the object is carried out by the application of a suitable voltage to the kinematic elements and/or the scan element. The arrangement of kinematic elements and the scan element on the same base plate, and the identical, piezoceramic material, dimensions and configurations for the kinematic elements and scan element leads to the same thermal expansion behavior and to an ideal compensation of thermal drifts.

Figure 3A:
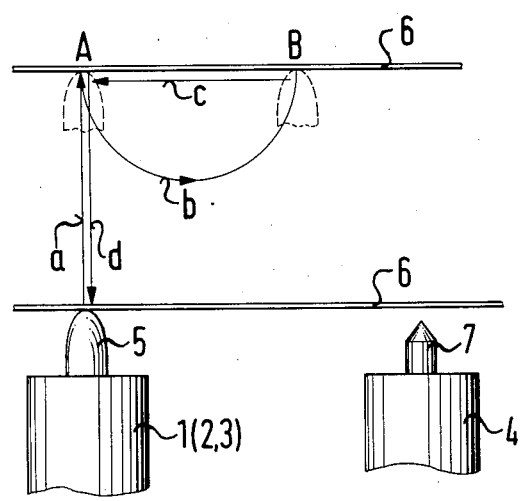
FIG. 3 illustrates the sequence of movements of the kinematic elements during the manipulation of an object, with the kinematic element jumping away from the object (FIG. 3a), with the sliding movement of the kinematic element along the surface of the object (FIG. 3b)

In order to obtain a displacement or rotation of the object, FIG. 3 schematically illustrates two possible motion cycles for the kinematic elements;

FIG. 3a illustrates a motion cycle, in which for the conveyance of an object from point A to point B, the support 5 of a kinematic element is moved in four sequential operating steps, as follows:

(a) Through the synchronized and uniform elongation of all three kinematic elements 1, 2, 3, the object is initially raised in a first step a in the Z-direction away from the operativ position of the tunneling tip 7.

(b) In the second step b, the kinematic elements are rapidly lowered in the Z-direction, pivoted hereby in the X-Y plane and again raised, such that there is obtained a somewhat semi-circular path as the line of movement. This second step b is so controlled in duration, that the speed of lowering of the supports 5 in the Z-direction is higher than the movement of the object in the same direction under the influence of gravity. The supports 5 of the kinematic elements detach themselves at point A from the object during the second operating step, because of the inertia of the object, and will again support the object at point B at the end of the operating step.

(c) The third step c is a slow movement of the support 5 in the X-Y plane, whereby the object remains resting on the three kinematic elements, and is being transported in the direction of the movement of the kinematic elements the distance between the points A and B.

(d) After completion of the transport the object is lowered in the fourth step to the normal operation distance of the tunnel tip in Z-direction. At the end of this operating step, the kinematic elements are again located in their initial position, and the object has been displaced by the distance between the points A and B.

The operating steps b and c can be repeated for so long, until the object has reached the operating position wich is desired for the STM examination. Thereafter follows step d for approaching the tunneling distance between tip 7 and object surface.

Figure 3B:
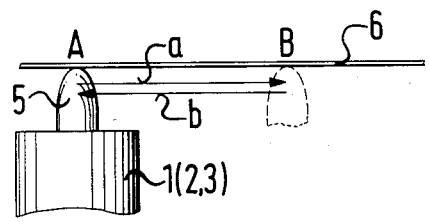

A motion sequence for the kinematic elements which is simplified in comparison with the above-described sequence is illustrated in FIG. 3b. The kinematic elements are, in accordance therewith, actuated in only two operating steps;

(a) As the first step a there is effected a rapid movement of the support 5 on the object surface from point A towards point B. During this movement of the kinematic elements, because its inertia the object again remains in an almost unchanged position.

(b) During the second step b the kinematic elements are slowly returned to their initial positions carrying the object over the distance between the points A and B.

Each of the motion sequences represented in FIGS. 3a and 3b can be carried out as a single step or can be repeated by applying of voltage pulse sequences to the kinematic elements. The step width and the step frequency of the supports on the kinematic elements can be varied within a wide range by a suitable control of voltage amplitude and pulse frequency. With the used piezoelectric kinematic elements reproducible micro steps of less than 10 nm could be carried out.

The motion sequences which can be carried out by means of the kinematic elements are not limited to the movements illustrated in FIGS. 3a and 3b. To the contrary, it is possible to correlate the movement of the kinematic elements with the applicable case of utilization. For example, in addition to the abovedescribed motion sequences, there are also possible elliptical movements of the supports, or an upward throw of the object with a rapid positional change of the supports. The control of the motion sequences is hereby carried out with consideration being given to the inertia of the object.

By means of the described kinematic arrangement it is also possible to impart rotation to the objects around an axis perpendicular to the support plane. The rotation of the object is effected through suitable vectorial addition of the voltages in the X- and Y-direction for each individual kinematic element. Moreover, the objects can also be tilted. For this purpose, the individual kinematic elements are to be differently elongated or shortened. The kinematic arrangement, in addition to translatory motions also allows for a rotation and tilting of the objects.

Figure 4:
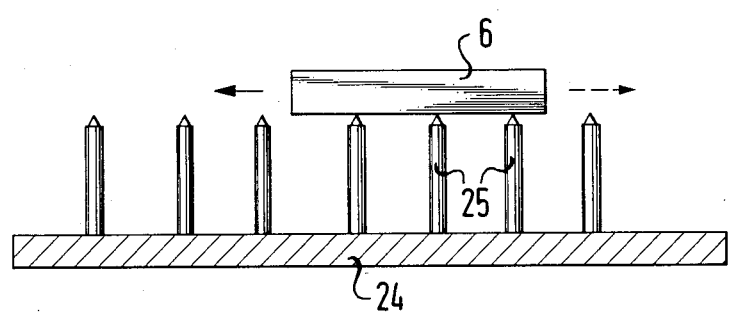
FIG. 4 illustrates a transport arrangement for the micro-movement of objects over a greater distance.

The described kinematic elements can also be applied for a precise transport of objects over extended distances. A transport table 24 with a plurality of mutually neighboringly arranged kinematic elements 25 is illustrated in FIG. 4. The kinematic elements are spaced relative to each other in such a distance, that the object will be supported all the time by at least 3 kinematic elements. The object can be transported to any position on the table 24.

Figure 5:
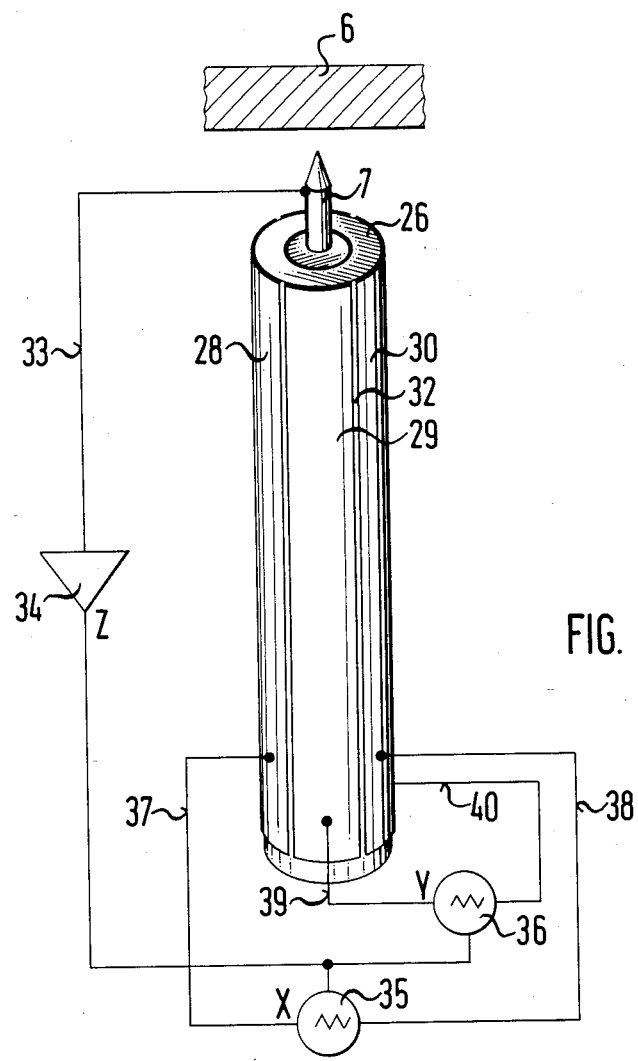
FIG. 5 illustrates a perspective view of a scan element.
Figure 5A:
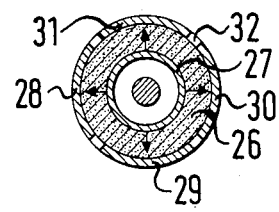
FIG. 5a illustrates a transverse section therethrough.

FIG. 5 illustrates, in a perspective representation, a scan element 4 of a kinematic arrangement for an STM as shown in FIG. 1. The scan element is constructed in the same manner as a kinematic element. It possess a tube 26 of the same, radially-polarized piezoelectric material as does the tube 9 in FIG. 2. It is provided on its internal cylindrical wall with a closed electrically-conductive coating 27 forming an inner elctrode, and on its external cylindrical wall with electrically-conductive part coatings 28 to 31, with insulating layers 32 in between. In contrast to the kinematic element, a tunnel tip 7 is connected to the scan element instead of the support 5.

FIG. 5 schematically illustrates the electrical connections for the scan element 4. The tunnel current is conducted from the tunneling tip 7 via the conductor 33 to the amplifier 34. The output voltage of the amplifier is employed for the movement of the scan element in the Z-direction (axial direction).

For scanning the tunneling tip 7 in the X- and Y-direction, two sweep generators 35 and 36 are used. The base potential of these generators is superimposed by the control voltage for the Z-direction. The outputs of the sweep generators are connected via the conductors 37, 38 and 39, 40 with the part coatings of the scan elements 28, 30 and 29, 31. The inner electrode 27 is in this embodiment connected to ground potential. In this manner, the inner electrode can serve as a shielding for the electrical conductor 33.

Figure 6:
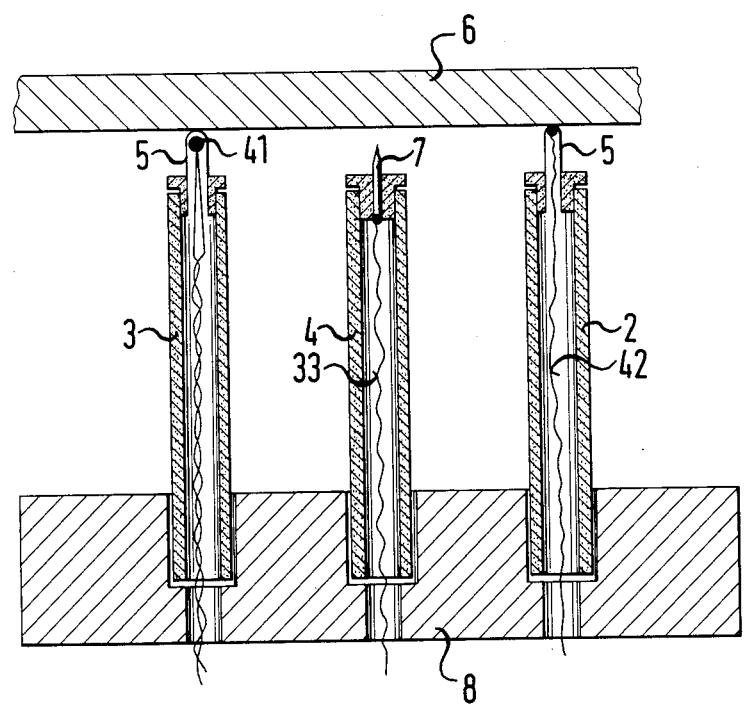
FIG. 6 illustrates kinematic elements with a thermal sensor and an electrical potential connection to the object including scan element, shown in a longitudinal sectional view.

FIG. 6 shows in a cross-sectional view different feedthroughs for conductors inside the kinematic elements 2, 3 and the scan element 4. The conductor 33 is connected to the tunnel tip and is shielded by the grounded inner electrode of the tube. The tunnel current is amplified and measured in the known and usual manner for STM's.

The temperature of the surface of the object can be measured by means of a thermal sensor 41, which is located inside the support 5 of the kinematic element 3, as shown in FIG. 6. The connections to the sensor are led through the inner of the tube of the kinematic element. In the embodiment of FIG. 6 a second kinematic element 2 is equipped with a conductor 42 which is connected to the support 5. Placing the object 6 onto the supports 5 provides an electrical conduct between the object and conductor 42. The potential of the object 6 can thus be varied or determined or the connector 42 can be used to measure the tunnel current beween object 6 and tunnel tip 7.

Figure 7:
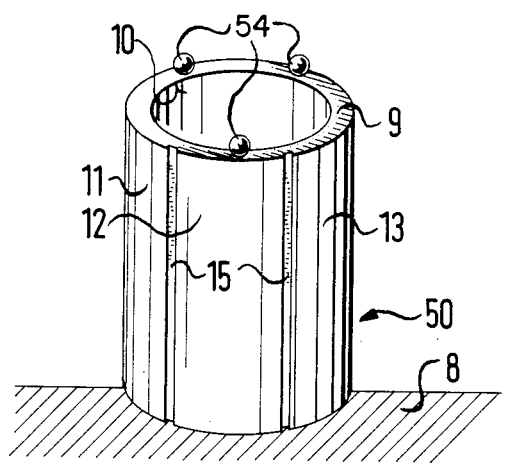
FIG. 7 gradually schematically illustrates a perspective view of another embodiment of a kinematic arrangement pursuant to the invention.

A further type of micromanipulator is illustrated in FIG. 7. The kinematic arrangement consists of only one kinematic element 50 similar to that in FIG. 2. The reference numbers correspond to identical construction elements. However, instead of a single support 5, the kinematic element has a plurality of supporting points or spheres 54 arranged circumferentially at the rim of the piezoceramic tube 9 in order to form a probe carrier. In FIG. 7 the minimum number of only 3 supporting spheres are shown. However, shape and number of the supports 54 can be varied depending on the special demands.

Figure 8:
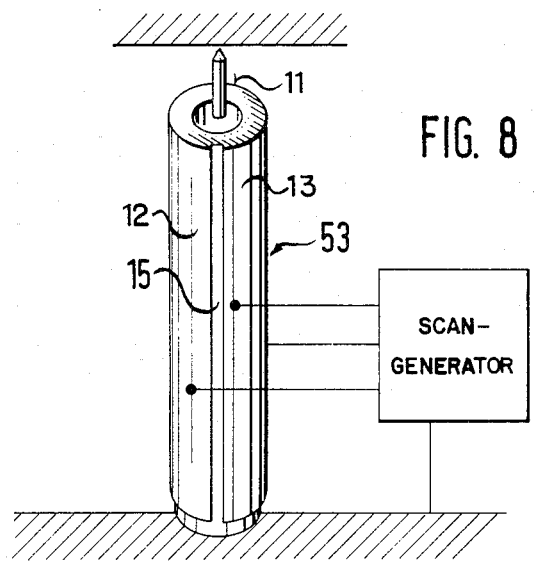
FIG. 8 illustrates a perspective view of a kinematic element modified with respect to that of FIG. 2.
Figure 9:
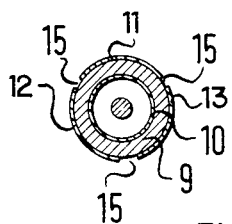
FIG. 9 illustrates a transverse sectional view through the kinematic element of FIG. 8.

The FIGS. 8 and 9 illustrate a possible variation of the kinematic element or scan element shown in the FIGS. 2 and 5. In this embodiment, only three outer electrodes are provided rather than four as in the previously described construction. This variation takes into account that the kinematic element can be bent in all X-Y-directions using only three electrodes.

The kinematic arrangement which is illustrated in the exemplary embodiment is not only employable for the movement of the object in an STM. Understandably, it can also be employed for the manipulation of an object for any kind of micromovement; for microscopic examinations, as well as for treatment of objects in the microtechnology. For example, it can be employed for microlithography; for this purpose the tunneling tip has to be replaced by a suited tool. Beside this, the general construction of the kinematic arrangement can, in principle, be maintained unchanged.

In modern high-integration technology the demand for precise spatially resolved analysis and treatment techniques is steadily growing. In the large scale integration of semiconductor devices, sub micron structures are envisioned. This goal can hardly be reached with conventional methods like optical or particle beam technology.

A kinematic arrangement of the described type is not only capable to analyze structures down to atomic dimensions using the STM method, but also to produce structures with lateral resolutions in the nm range. In the simplest instance, the construction of such an arrangement can be similar to that of the previously described STM application. The object which is to be analized or treated again rests on at least three supporting elements. For treatment purposes the tunnel tip has to be replaced by a treating tool. This treating tool, for example, can consist of a sharply-pointed diamond tip which can be conveyed over the surface of the object digging apertures and carving structures on the surface of the object. The operations can be implemented at high speeds and with high precision using computer controls. Since the arrangement is capable of transporting the object with high resolution over large distances, semiconductor wavers of large dimensions can be implemented with microstructures.

Adapted as a further treating implement, which can be mounted on a kinematic element, is also a field-emission tip. Caused by electron or ion emission, or only by high electrical fields, surface atoms and molecules can be locally activated. This procedure can be utilized, for example, for the localized cracking of hydrocarbon compounds, which leads to a chemical conversion of the "treated" molecules.

A further utilization for the described kinematic arrangement with a treating element is in the field of microbiology. Organic molecular chains, viruses or bacteria can not only be analyzed, but through the application of fields at localized target points, a separation or modification of the molecular chain can be carried out. This capability of a local operation in the molecular range also opens completely new possibilities in the field of genetic technology.

It is also logical, within the scope of the invention, that the kinematic element or elements or the arrangement are inverted so as to be supported on the upper surface of a positionally fixed or stationary object which is to be scanned. In other words the kinematic arrangement is capable to walk or crawl over the surface of the object in a "beetle-like" manner, allowing thus the investigation or treatment of larger objects.

What is claimed is:

1. Micromanipulator for the micro-movement of objects, for imparting relative microscopic movements between the micromanipulator and objects which are to be examined or treated microscopically; comprising at least one kinematic element positioned for supporting or being supported by said object, said at least one kinematic element being constituted from a piezoelectric material and being deformable through the application of electrical voltages, at least a portion of said at least one kinematic element being hollow-cylindrical; support means for said object being located at one end surface of said at least one element; and a closed, continuous electrically-conductive coating being provided on one cylindrical surface of said at least one hollow-cylindrical kinematic element, and a plurality of electrically-conductive part coatings, which are electrically insulated relative to each other, being provided on the other cylindrical surface.

2. Micromanipulator as claimed in claim 1, wherein said support means comprises a single support point projecting from said at least one kinematic element.

3. Micromanipulator as claimed in claim 1, wherein said support means comprises a plurality of object-supporting surfaces circumferentially distributed along the end surface of said at least one element.

4. Micromanipulator as claimed in claim 1, wherein said part coatings which are insulated relative to each other extend along said other cylindrical surface in the direction of the cylinder axis; and an insulation between said part coatings extending between said part coatings in parallel with the cylinder axis.

5. Micromanipulator as claimed in claim 1, wherein said electrically insulated part coatings are provided on the external cylindrical surface of at least one element.

6. Micromanipulator as claimed in claim 1, wherein means are provided for applying to said closed coating and to said part coating a separate electrical operating voltage in conformance with the intended movement of the object.

7. Micromanipulator as claimed in claim 1, wherein means are provided for applying a direct voltage superimposable on an alternating-current voltage required for the operation of said arrangement.

8. Micromanipulator as claimed in claim 1, wherein said at least one kinematic element is rigidly interconnected with a scan element of a scanning-tunneling microscope supporting the tunnel tip of said scanning-tunneling microscope.

9. Micromanipulator as claimed in claim 8, wherein said scan element has a construction analogous to the construction of said at least one kinematic element.

10. Micromanipulator as claimed in claim 8, wherein the scanning movements of said arrangement are provided by said at least one kinematic element.

11. Micromanipulator as claimed in claim 8, wherein said at least one kinematic element comprises a thermal sensor means for effecting the temperature measurement of the object.

12. Micromanipulator as claimed in claim 8, wherein said at least one kinematic element comprises a means for contacting the object under investigation.

13. Micromanipulator as claimed in claim 1, wherein said arrangement includes an object treating implement means.

* * * * *